(12) United States Patent
Johnson et al.

(10) Patent No.: US 7,723,980 B2
(45) Date of Patent: May 25, 2010

(54) FULLY TESTED WAFERS HAVING BOND PADS UNDAMAGED BY PROBING AND APPLICATIONS THEREOF

(75) Inventors: Morgan T. Johnson, Portland, OR (US); Raymond J. Werner, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 33 days.

(21) Appl. No.: 12/079,159

(22) Filed: Mar. 24, 2008

(65) Prior Publication Data
US 2008/0230927 A1 Sep. 25, 2008

Related U.S. Application Data

(60) Provisional application No. 60/919,521, filed on Mar. 22, 2007.

(51) Int. Cl.
*G01R 31/02* (2006.01)
*G01R 31/26* (2006.01)

(52) U.S. Cl. .................. 324/158.1; 324/760; 324/765; 324/754

(58) Field of Classification Search .................. None
See application file for complete search history.

(56) References Cited

U.S. PATENT DOCUMENTS 5,084,671 A * 1/1992 Miyata et al. ............... 324/760
6,991,969 B2 * 1/2006 Johnson ...................... 438/125
7,319,341 B1 * 1/2008 Harms et al. ................ 324/765
2001/0040464 A1 * 11/2001 Tanioka et al. .............. 324/765
2003/0094962 A1 * 5/2003 Rincon et al. ............... 324/754

FOREIGN PATENT DOCUMENTS

EP        305951 A1 *  3/1989

\* cited by examiner

*Primary Examiner*—Paresh Patel
(74) *Attorney, Agent, or Firm*—Raymond J. Werner

(57) ABSTRACT

Methods and apparatus for producing fully tested unsingulated integrated circuits without probe scrub damage to bond pads includes forming a wafer/wafer translator pair removably attached to each other wherein the wafer translator includes contact structures formed from a soft crushable electrically conductive material and these contact structures are brought into contact with the bond pads in the presence of an inert gas; and subsequently a vacuum is drawn between the wafer and the wafer translator. In one aspect of the present invention, the unsingulated integrated circuits are exercised by a plurality of test systems wherein the bond pads are never physically touched by the test system and electrical access to the wafer is only provided through the inquiry-side of the wafer translator. In a further aspect of the present invention, known good die having bond pads without probe scrub marks are provided for incorporation into products.

7 Claims, 4 Drawing Sheets

FULLY TESTED WAFERS HAVING BOND PADS UNDAMAGED BY PROBING AND APPLICATIONS THEREOF

RELATED APPLICATIONS

This non-provisional application claims the benefit of earlier filed provisional application 60/919,521, filed 22 Mar. 2007, and entitled "Fully Tested Wafers Having Bond Pads Undamaged By Probing And Applications Thereof"; the entirety of which is hereby incorporated by reference.

FIELD OF THE INVENTION

The present invention relates generally to semiconductor test equipment, and semiconductor components. More particularly, the present invention relates to methods and apparatus for providing semiconductor components that have been electrically tested without introducing probe-induced damage.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with the probe needles of a probe card. Unfortunately, the probe needles scrub the pad metal to make adequate electrical contact, and in the process significantly disturb and redistribute the pad metal. This pad damage can reduce the strength and reliability of wire bonds made to those damaged pads.

What is needed are methods and apparatus that provide access to the pads of unsingulated integrated circuits without damaging those pads by probe scrubbing.

SUMMARY OF THE INVENTION

Briefly, methods and apparatus for producing fully tested unsingulated integrated circuits without probe scrub damage to bond pads includes forming a wafer/wafer translator pair removably attached to each other wherein the wafer translator includes contact structures formed from a soft crushable electrically conductive material and these contact structures are brought into contact with the bond pads in the presence of an inert gas; and subsequently a vacuum is drawn between the wafer and the wafer translator.

In one aspect of the present invention, the unsingulated integrated circuits are exercised by a plurality of test systems wherein the bond pads are never physically touched by the test system and electrical access to the wafer is only provided through the inquiry-side of the wafer translator.

In a further aspect of the present invention, known good die having bond pads without probe scrub marks are provided for incorporation into products.

DETAILED DESCRIPTION

Figure 1:
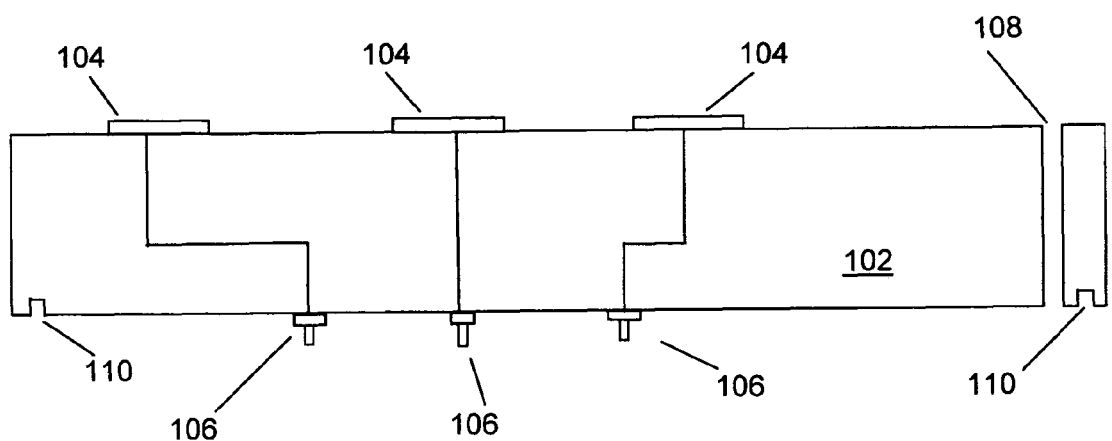
FIG. 1 is a cross-sectional view of an illustrative wafer translator.

Generally, the use of a wafer translator and a wafer, removably attached to each other, provides the electrical connection to the pads of integrated circuits on a wafer in such a manner that the pads are substantially undamaged in the process of making such electrical connections. Unlike conventional means and methods of providing electrical connections to the pads of unsingulated integrated circuits for testing purposes, the wafer/wafer translator pair provide electrical connections without "scrubbing" the pads, thereby reducing or eliminating the damage done to pads by conventional processes and equipment.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components, devices, or equipment. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

Inquiry system refers to devices or equipment, the intended function of which may include, but is not limited to, providing power, and/or signals to one or more integrated circuits on a wafer, and/or receiving one or more signals from one or more integrated circuits on a wafer. One example of an inquiry system is semiconductor test system.

Inquiry system interface refers to apparatus disposed between the inquiry side of a translator and an inquiry system. Inquiry system interfaces provide at least electrical pathways coupled between the inquiry side of a translator and an inquiry system. Inquiry system interfaces may incorporate a variety of passive and/or active electrical components, as well as a variety of mechanical devices for attaching, coupling, connecting, or communicating to the inquiry side of a translator and/or the inquiry system (e.g., a tester). Various implementations of inquiry system interfaces may be as simple as a circuit board that passes signals from one surface to the other, or may be complex apparatus including active electronics, and mechanical devices suitable for placing, orienting and/or aligning the inquiry system interface.

The expression "edge extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge extended translator.

The expression "translated wafer" refers to a wafer/wafer translator pair that are in the attached state, wherein a predetermined portion of, or all of, the contact pads of the integrated circuits on the wafer are in electrical contact with corresponding electrical connection means disposed on the wafer-side of the translator. Removable attachment may be achieved, for example, by means of vacuum, or pressure differential, attachment.

Advanced inquiry transport refers to a wafer/wafer translator pair in the attached state (i.e., a translated wafer) that are further provided with a lip seal mechanism and a support ring, or suitable alternative support structure, such that the translated wafer may maintain vacuum attachment and be easily transported from one inquiry system to another, wherein each of these inquiry systems is equipped with an inquiry system interface.

FIG. 1 is a cross-sectional view (not to scale) of an illustrative wafer translator. The illustrative wafer translator includes a substrate 102, with contact pads 104 disposed on a first surface, and contact structures 106 disposed on a second surface. An evacuation pathway 108 allows a vacuum to be drawn between the wafer translator and a wafer to which it may be removably attached. A circumferential groove 110 may be provided on the wafer-side of the translator in which a gasket or seal ring may be seated, in order facilitate a vacuum seal between the wafer translator and a wafer. Contact structures 106 make physical and electrical contact with the bond pads of integrated circuits on the wafer when that wafer and the wafer translator are brought into the attached state. Contact structures 106 may be formed from a soft or crushable metal such as gold. An electrically conductive pathway is provided through substrate 102 so as to electrically connect with contact pads 104. Contact pads 104 provide electrical access to testing equipment. Contact pads 104 are typically much larger than contact structures 106, and are formed so as to have a larger pitch than contact structures 106. Contact structures 106 leave the bond pads which they come in contact with in a substantially undamaged state. That is, the bond pads are not scrubbed in order to make electrical contact with contact structures 106.

Rather than scrubbing, a flow of an inert gas, e.g., argon, is provided between the wafer and the wafer translator as contact structures 106 are brought into contact with the bond pads of the wafer and then a vacuum is drawn to put the wafer/wafer translator pair into the attached state. In this way, a low resistance connection is made to the bond pads without scrubbing and without the pad damage that results from scrubbing. Because the post-contact pad surface, in accordance with the present invention, is substantially planar and undamaged, as compared to alternatives in which probe marks disturb and redistribute pad metal, subsequent use or function of the bond pad is unaffected by the translator touchdown.

Figure 2:
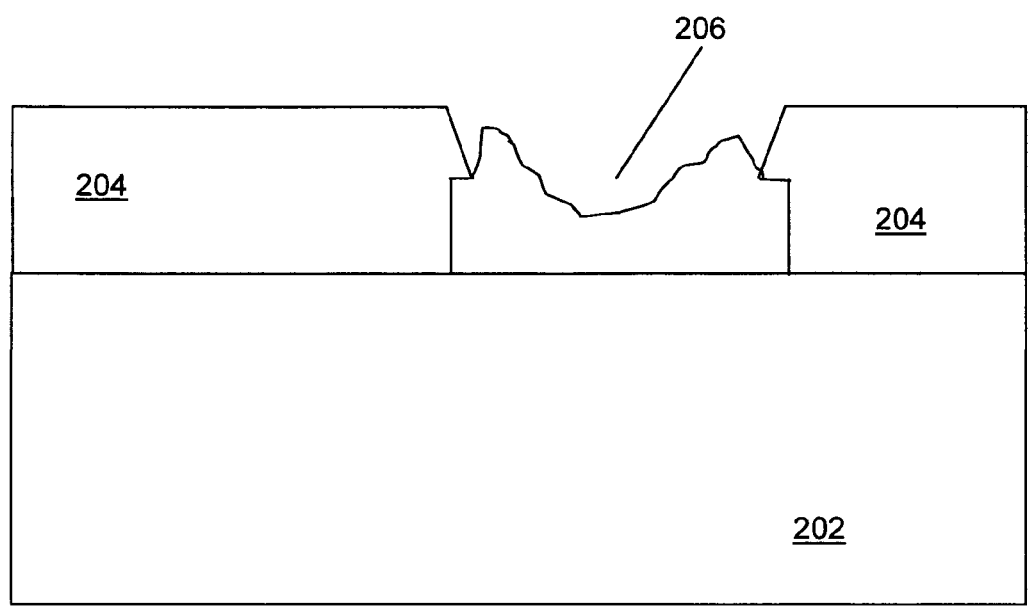
FIG. 2 is a cross-sectional representation of a bond pad on an integrated circuit that exhibits scrub damage subsequent to testing by conventional means.

Referring to FIG. 2, a cross-sectional representation (not to scale) of a bond pad on an integrated circuit subsequent to conventional probe scrub damage from the testing process is shown. More particularly, an integrated circuit substrate 202 has a bond pad 206 and a passivation layer 204 disposed thereon. The exposed surface of bond pad 206 is non-planar. This non-planarity results from the action of conventional probe operations and equipment used to test the integrated circuit.

Figure 3:
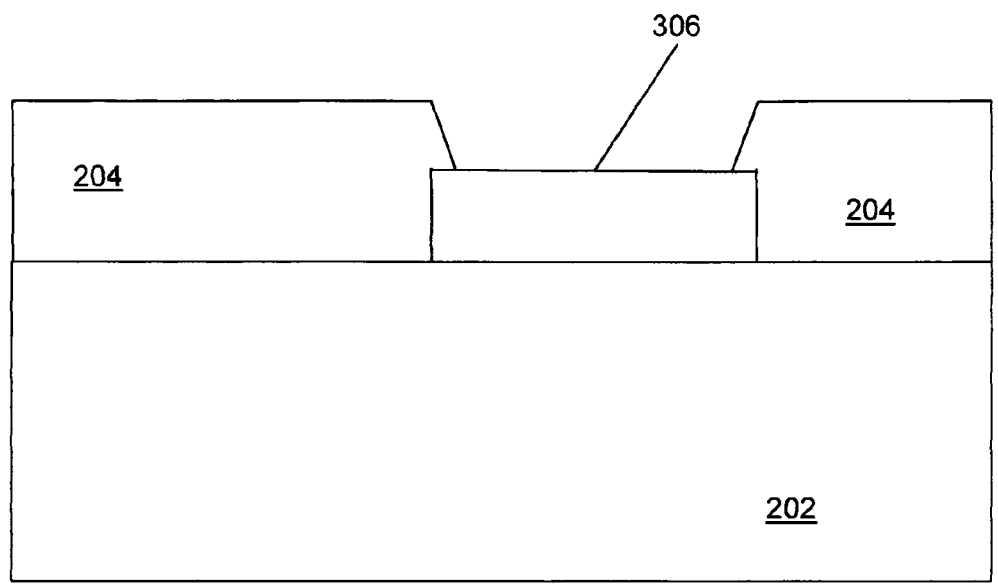
FIG. 3 is a cross-sectional representation of a bond pad on an integrated circuit that is free from probe scrub damage subsequent to testing in accordance with present invention.

Referring to FIG. 3, a cross-sectional representation (not to scale) of a bond pad on an integrated circuit subsequent to the testing process in accordance with the present invention is shown. More particularly, an integrated circuit substrate 202 has a bond pad 306 and a passivation layer 204 disposed thereon. The exposed surface of bond pad 306 is substantially planar. This post-contact planarity results from the use of a wafer translator with soft crushable contact structures. In some embodiments these soft crushable contact structures are gold stud bumps.

Since the pads of an integrated circuit are essentially undamaged by the touchdown of a wafer translator, multiple translator touchdowns may be made without reducing the reliability of subsequently formed wire bonds to those pads.

Alternatively, the translator may make a single touchdown on a wafer and remain attached while the wafer/wafer translator pair, or advanced inquiry transport assembly, are processed through multiple test machines wherein those test machines or inquiry systems, each equipped with an inquiry system interface, physically contact the wafer translator rather than directly contacting the pads of the integrated circuits on the wafer. In this way, multiple test, or inquiry, operations may be performed with a variety of physical and electrical set-ups while the pads only receive a single touchdown from the wafer translator. Again, pad damage is substantially reduced or eliminated thereby improving the reliability of wire bonds made to those pads.

Various embodiments of the present invention provide tested integrated circuits in wafer, or unsingulated, form, wherein the bond pads are free from probe marks and all the damage that is typically caused by the scrubbing action of probe structures. In accordance with the present invention, the pads remain unscrubbed, regardless of whether there is a translator touchdown associated with each of multiple test steps, or a single translator touchdown and each test step contacts the translator rather than the wafer. With the wafer/wafer translator pair removably attached to each other, the test, or inquiry systems, may electrically interact with the unsingulated integrated circuits of the wafer but they never physically touch the wafer.

In some embodiments of the present invention, known good die having bond pads without probe scrub marks are provided for incorporation into products. This is enabled by the use of the wafer translator and attachment process described above. That is, the wafer translator provides low resistance contact to the bond pads without scrubbing and associated scrub damage, and intercepts the physical contact mechanisms of the various test systems. In this way, the locations on the wafer of known good die are identified and these die, after singulation are provided for any desired assembly operation.

Figure 4:
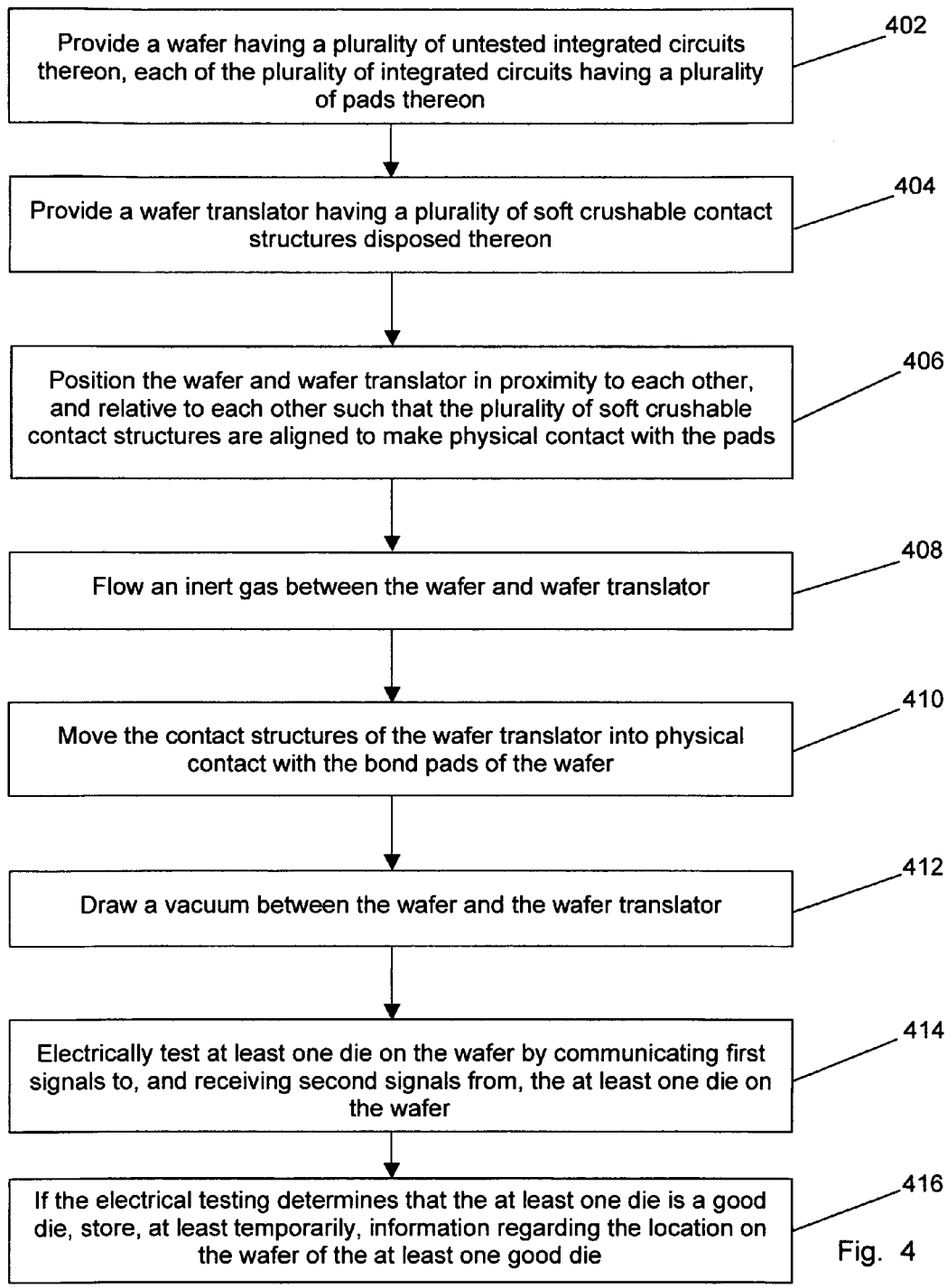
FIG. 4 is a flow diagram of an illustrative process for producing tested integrated circuits with undamaged bond pads in accordance with the present invention.

Referring to FIG. 4, an illustrative embodiment of the present invention is described. More particularly, a method of producing at least one known good die on an unsingulated wafer, the at least one known good die having a plurality of pads through which information has been electrically communicated, and those pads being free from probe scrub damage, includes providing 402 a wafer having a plurality of untested integrated circuits thereon, each of the plurality of integrated circuits having a plurality of pads thereon; providing 404 a wafer translator having a plurality of soft crushable contact structures disposed thereon; positioning 406 the wafer and wafer translator in proximity to each other, and relative to each other such that the plurality of soft crushable contact structures are aligned to make physical contact with the pads; flowing 408 an inert gas between the wafer and wafer translator; moving 410 the contact structures of the wafer translator into physical contact with the bond pads of the wafer; drawing 412 a vacuum between the wafer and the wafer translator; electrically testing 414 at least one die on the wafer by communicating first signals to, and receiving second signals from, the at least one die on the wafer; and if the electrical testing determines that the at least one die is a good die, storing 416, at least temporarily, information regarding the location on the wafer of the at least one good die.

In one embodiment of the present invention, an article of manufacture, includes a plurality of tested integrated circuits disposed on a wafer, each of the integrated circuits having a plurality of bond pads; wherein the bond pads are free from probe marks.

In another embodiment of the present invention, a plurality of unsingulated known good electronic components on a wafer, includes a wafer having a plurality of unsingulated integrated circuits; and a database including information representative of the location of each known good electronic component on the wafer; wherein each of the plurality of unsingulated integrated circuits has a plurality of pads, each of the plurality of pads has been in electrical communication with a tester external to the wafer, and each of the plurality of pads is free from probe scrub damage.

In some embodiments of the present invention, advanced inquiry transport may be robotically transferred among a plurality of inquiry systems. Since operator intervention is not required to move the advanced inquiry transport amongst inquiry systems, the layout of the test floor enabled by embodiments of the present invention may be made smaller.

CONCLUSION

The exemplary methods and apparatus illustrated and described herein find application in at least the field of integrated circuit test and analysis.

It is to be understood that the present invention is not limited to the embodiments described above, but encompasses any and all embodiments within the scope of the subjoined Claims and their equivalents.

What is claimed is:

1. A method of producing at least one known good die on an unsingulated wafer, the at least one known good die having a plurality of pads through which information has been electrically communicated, and those pads being free from probe scrub damage, comprising:

providing a wafer having a plurality of untested integrated circuits thereon, each of the plurality of integrated circuits having a plurality of pads thereon;

providing a wafer translator having a plurality of soft crushable contact structures disposed on a wafer-side thereof, the wafer translator being removably attachable to the wafer, and having an inquiry-side opposite to the wafer-side;

positioning the wafer and wafer translator in proximity to each other, and relative to each other such that the plurality of soft crushable contact structures are aligned to make physical contact with the pads;

subsequent to positioning the wafer and wafer translator in proximity to each other, flowing an inert gas between the wafer and wafer translator;

subsequent to flowing the inert gas, moving the contact structures of the wafer translator into physical contact with the bond pads of the wafer;

subsequent to moving the contact structures of the wafer translator into physical contact with the bond pads of the wafer, drawing a vacuum between the wafer and the wafer translator;

electrically testing at least one die on the wafer by communicating first signals to, and receiving second signals from, the at least one die on the wafer; and if the electrical testing determines that the at least one die is a good die, storing, at least temporarily, information regarding the location on the wafer of the at least one good die;

wherein the contact structures of the wafer translator do not scrub the pads of the at least one known good die.

2. The method of claim 1, wherein the inert gas is argon.

3. The method of claim 1, wherein the contact structures are gold stud bumps.

4. The method of claim 1, further comprising:

separating the removably attached wafer translator and the wafer from each other.

5. The method of claim 1, wherein electrically testing at least one die on the wafer comprises coupling the inquiry-side of the wafer translator to an inquiry system.

6. The method of claim 1, further comprising, disposing an inquiry system interface such that at least portions of the inquiry system interface and one or more contact pads on the inquiry-side of the wafer translator are in electrical contact with each other.

7. The method of claim 1, wherein drawing a vacuum between the wafer and the wafer translator comprises evacuating one or more gases through an evacuation pathway in the wafer translator.

* * * * *